United States Patent
Young

[11] Patent Number: 5,945,699
[45] Date of Patent: Aug. 31, 1999

[54] REDUCE WIDTH, DIFFERENTIALLY DOPED VERTICAL JFET DEVICE

[75] Inventor: William R. Young, Palm Bay, Fla.

[73] Assignee: Harris Corporation, Melbourne, Fla.

[21] Appl. No.: 08/855,385

[22] Filed: May 13, 1997

[51] Int. Cl.$^6$ .................................................. H01L 29/00
[52] U.S. Cl. .................. 257/256; 257/263; 257/270; 257/272; 257/287
[58] Field of Search .................. 257/256, 263, 257/270, 272, 287; 438/186

[56] References Cited

U.S. PATENT DOCUMENTS

| | | | |
|---|---|---|---|
| 3,982,263 | 9/1976 | Dobkin | 357/22 |
| 3,999,207 | 12/1976 | Arai | 357/22 |
| 4,176,368 | 11/1979 | Compton | 357/22 |
| 4,203,781 | 5/1980 | Miller | 148/1.5 |
| 4,215,356 | 7/1980 | Kato | 357/22 |
| 4,266,233 | 5/1981 | Bertotti et al. | 357/22 |
| 4,373,253 | 2/1983 | Khadder et al. | 29/576 |
| 4,611,384 | 9/1986 | Bencuya et al. | 29/571 |
| 5,106,770 | 4/1992 | Bulat et al. | 437/40 |
| 5,264,381 | 11/1993 | Harada | 437/40 |
| 5,340,757 | 8/1994 | Chantre et al. | 437/40 |
| 5,414,289 | 5/1995 | Fitch et al. | 257/329 |
| 5,488,241 | 1/1996 | Journeau | 257/273 |
| 5,637,889 | 6/1997 | Groover et al. | 257/192 |
| 5,710,443 | 1/1998 | Blanchard | 257/110 |

FOREIGN PATENT DOCUMENTS

| | | |
|---|---|---|
| 56-012777 | 7/1981 | Japan . |
| 57-192065 | 11/1982 | Japan . |

OTHER PUBLICATIONS

"Session VI: Digital Circuit Techniques—MOS Buried Load Logic" by Yoshio Sakai et al; 1980 IEEE International Solid–State Circuits Conference, pp. 56–57.

*Primary Examiner*—Valencia Martin-Wallace
*Attorney, Agent, or Firm*—Charles E. Wands

[57] ABSTRACT

A load device for an MOS transistor, such as that of a memory cell, includes a differentially doped vertical JFET structure that contains two separate and distinct opposite conductivity type regions. The interior region has the same conductivity as the well in which the JFET is formed, and is surrounded by the JFET channel region which has a generally annular shape. The pinch-off voltage of the annular vertical JFET channel is established by its cross-sectional thickness and doping profile. This reduced thickness, annular-shaped, vertical JFET channel provides a limited current flow path that can be very precisely tailored to restrict current flow to what is essentially a leakage current path, and thereby provide a very high load impedance.

7 Claims, 3 Drawing Sheets

REDUCE WIDTH, DIFFERENTIALLY DOPED VERTICAL JFET DEVICE

FIELD OF THE INVENTION

The present invention relates in general to integrated circuits and devices and is particularly directed to a new and improved vertical JFET load device for an MOS device, such as an MOS memory cell, which not only serves to increase the integration density of the memory cell, but enables the current through the load device to be predictably and precisely controllable for each cell of a multi-cell memory array.

BACKGROUND OF THE INVENTION

A paper by Y. Sakai et al, entitled: "MOS Buried Load Logic," presented at the 1980 International Solid-State Circuits Conference of the IEEE, describes a technique for improving the integration density of a multi-cell MOS memory array, by configuring load devices for respective memory cells as vertical or buried JFET structures. According to the basic cell architecture described in this paper, and illustrated in the structural sectional view of FIG. 1 and the schematic view of FIG. 2, a portion of (a N-type) substrate 10 is masked in the course of formation of a (P-type) well 12 in which an (N)MOS device 14 is formed, so as to leave a 'hole' 16 through the well and thereby form the channel of a vertical N-type (JFET) load device 17, which is intersected by a subsequently formed (N+) drain region 18 of the MOS device 14. With the load (the buried JFET) being 'buried' within the same well region as the MOS cell, so that it does not occupy additional horizontal or surface semiconductor real estate on the memory chip, the integration density of the memory array is increased.

Unfortunately, because the pinch off voltage and cross-sectional dimensions of the vertical load JFET's channel region are determined by the processing conditions used to define the size of the 'hole' 16 formed through the P well, repeatability among different memory chip lots is poor. In addition, since the entirety of the JFET channel coincides with the entirety of the hole through the well, the load JFET device consumes substantial power—a less than ideal property of a load device, which should serve to provide a high impedance and provide only a minimum leakage current that is just sufficient to maintain the storage node at its intended logic level.

SUMMARY OF THE INVENTION

In accordance with the present invention, these shortcomings of a conventional prior art vertical JFET load device of the type described above are effectively obviated by means of a new and improved differentially doped, restricted channel, vertical JFET architecture, that is readily incorporated into a well structure of a standard CMOS architecture, such as a multi cell CMOS memory array. As will be described, this differentially doped JFET architecture provides a reduced width channel region having a generally annular shape, rather than one that is coextensive with the entirety of the cross-section through the 'hole' in the well of the prior art structure described above. As a result, the current flow path through what is relatively 'thin-walled' channel region of the vertical JFET of the present invention can be very precisely tailored to restrict current flow to what is essentially a leakage current path, and thereby provide a higher effective impedance, as is desirable for a RAM cell. The pinch-off voltage of the vertical JFET is established by the thickness and its doping profile of the annular channel region.

To form the differentially doped vertical JFET structure of the present invention in a PMOS architecture as a non-limiting example, either prior or subsequent to formation of P+source and drain regions of the PMOS device, the structure is selectively masked, to expose only a prescribed portion of the N-well. A dual implant of opposite conductivity type impurities, having respectively different diffusion coefficients, is then conducted, so as to form a dual polarity impurity-doped region through the N-well to the underlying P-type substrate.

For this N well structure, the first implant may comprise an implant of an N-type dopant implant having a relatively small diffusion coefficient, such as arsenic or antimony, followed by a second implant of a P-type dopant having a relatively large diffusion coefficient, such as boron. Because boron has a diffusion coefficient that is considerably greater than arsenic or antimony, then during a subsequent anneal step, the implanted boron will diffuse farther into the N-well than the arsenic or antimony, so as to result in the formation of a differentially doped vertical JFET channel region that contains two separate and distinct opposite conductivity type regions.

An interior one of these two distinct regions will have N-type conductivity, which will have diffused only slightly outwardly from its initially implant location beneath the mask aperture. Contiguous with and surrounding this interior N-type region is a generally annular shaped, outer P-type region, which is effectively 'sandwiched' between the N-type interior region and the N-type material of the surrounding N-well.

The dual conductivity region, restricted channel JFET of the present invention is located so as to underlie the drain region of its associated MOS device, and thereby provide a load connection between drain region of the MOS device and the channel of the vertical JFET, which is terminated at the potential of the underlying substrate to which the vertical JFET extends.

The relationship between the capacitance C of the junction between the drain and the well and applied well voltage, and that between MOS threshold voltage and the reverse bias voltage applied between the source and the well are such that an increase in the well-to-source voltage of the MOS device causes a decrease in the drain-to-well junction capacitance and an increase in the MOS threshold voltage. Since the vertical JFET uses the MOS well as its gate, increasing the well-to-source voltage will decrease the JFET's source-to-drain current. By initially setting the parameters of the MOS device for a prescribed operation, depletion mode, for example, biasing the well can be used to control the MOS threshold, drain-to-well capacitance, and drain-to-source current of the vertical JFET.

This setting can be maintained by means of an associated feedback control circuit, such as one containing a charge pump circuit, which is coupled to monitor the memory cell node voltage of one of the MOS cells in a multi-cell array. This monitored voltage is compared with a prescribed reference voltage. The difference between the two can be used to control the application of a bias voltage to the well of each of the MOS devices in the multi-cell array, thereby establishing the maximum vertical JFET standby current for each memory cell array.

DETAILED DESCRIPTION

The improved MOS cell architecture of the present invention will now be described with reference to FIGS. 3–7, which diagrammatically show successive steps employed in the formation of a P-channel vertical JFET in a CMOS architecture. It should be observed that the invention is not limited to use with a particular polarity type of device, but is applicable to either a PMOS structure, having an associated vertical PJFET, or an NMOS structure, having an associated vertical NJFET. For purposes of providing a non-limiting illustrate example, the invention will be described for the formation of a vertical PJFET as a load device of a PMOS structure of a conventional CMOS process.

Figure 3:
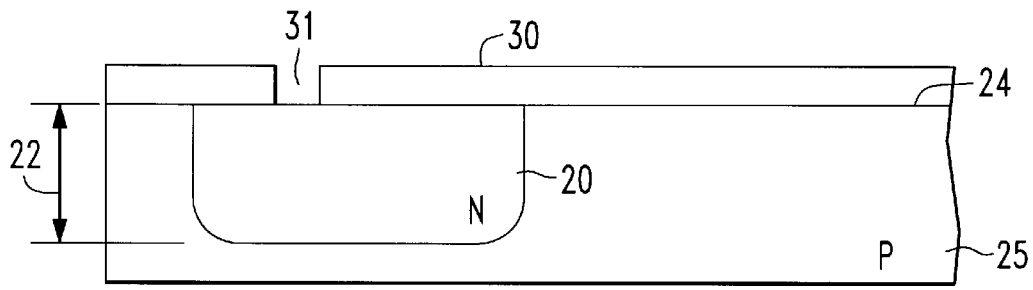
FIGS. 3–8 diagrammatically show successive steps employed in the formation of an improved differentially doped, vertical JFET-containing MOS cell architecture of the present invention for the case of a PJFET structure.

In such a process, as shown in FIG. 3, an N-type well 20 is formed to a depth 22 from a top surface 24 of a P-type silicon substrate 26. Pursuant to conventional industry practice, N-well 20 is to contain a PMOS device, while material of the substrate 26 adjacent to the N-well is to contain the NMOS device of a respective CMOS structure. The differentially doped vertical 'JFET' structure may be formed either prior to or subsequent to the formation of the CMOS structure. In the following description, as a non-limiting example, the vertical JFET structure will be described as being formed prior to forming the source and drain regions of the CMOS device. However, it is to be understood that the CMOS devices may be formed first without departing from the scope of the invention.

As shown at 30 in FIG. 3, the structure is selectively masked, so as to expose, via an implant aperture 31, a dual implant surface area for forming a differentially doped vertical JFET structure. Implant aperture 31 is sized to expose a prescribed portion of the surface of the N-well (into which a P dopant for the PMOS drain region is to be subsequently introduced using a conventional source and drain P+ implant—anneal drive in step). The size, shape and location of the dual implant mask aperture 31 are such that, during a subsequent anneal step, the extent of side diffusion of differential polarity (N and P) impurities implanted through the aperture 31 will be less than width of a subsequently formed P+ drain region, which will overlap the dual polarity implanted JFET channel region.

Figure 4:
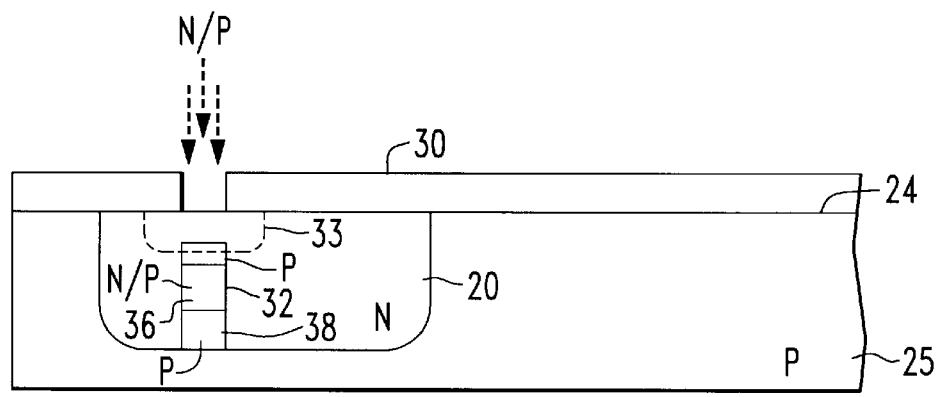

With the surface of the substrate thus masked, a dual implant of opposite conductivity type impurities, having differential diffusion coefficients is conducted through the aperture 31 in the mask 30, to form a dual polarity impurity-doped region, as shown at 32 in FIG. 4. For the present example of an N well structure, the first implant may implant an N-type dopant having a relatively small diffusion coefficient, such as arsenic or antimony, shown as implanted region 36, which is followed by second implant of a P-type dopant having a relatively large diffusion coefficient, such as boron, shown at 38. Alternatively, the P-type dopant may be implanted first, followed by the N-type implant. In either case, the channel implant (here the P-type implant) 38 has a depth that reaches the underlying P-substrate 25, so as to ensure that a continuous vertical P channel region is provided between the underlying P-type substrate 25 and an overlying P-type drain shown in dotted lines 33. (As noted above, although it is to be formed subsequent to the formation of the JFET channel in the present non-limiting example, the overlying drain (P-type in the present example) may alternatively be formed prior to the formation of the vertical JFET channel.)

The channel-restricting implant (here, the N-type implant) 36, on the other hand, need not extend all the way to the underlying P-type substrate 25, nor must it overlap the P-type drain, since the purpose of the channel restricting implant is to reduce the effective cross section of the vertical JFET channel to that of a relatively narrow (annular) region, in order to control the threshold voltage and current capability of the JFET.

Where the vertical JFET to be formed is a P-channel JFET, as in the present example, the process can be simplified by taking advantage of the fact that boron (a P-type implant) has a diffusion coefficient in silicon that is considerably greater than arsenic or antimony (an N-type implant), so that implanted boron will diffuse farther into the N-well 20 than the N-type dopant (arsenic or antimony), resulting in the formation of a differentially doped vertical 'JFET' structure having the desired reduced channel cross-section.

Figure 5:
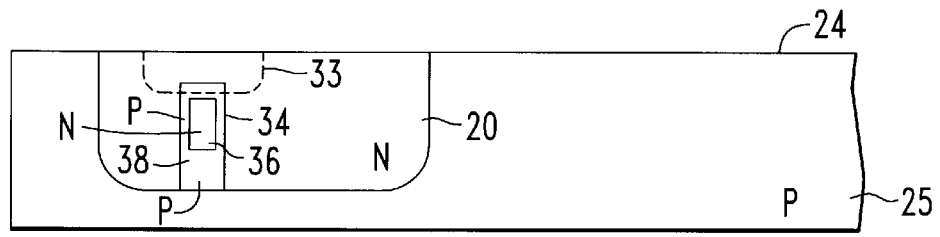
Figure 6:
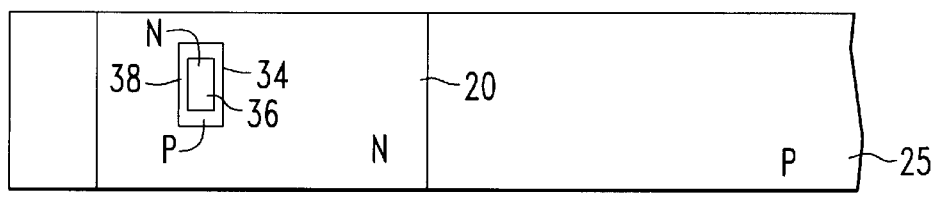

More particularly, as shown in the side sectional view of FIG. 5 and the top view of FIG. 6, as a result of the different diffusion coefficients of the P and N implants, the anneal step will produce a vertical JFET doping profile having a generally central or interior region 36 of N-type conductivity, as defined by the N-type material of the implanted N-type dopant (e.g., arsenic) that has diffused only slightly outwardly from its initially implant location beneath the mask aperture 30, and a generally annular shaped, outer P-type region channel 38, that surrounds the interior N-type region 36 as a result of the slightly increased outward diffusion of the boron into the surrounding material of the N-well 20. The sidewalls of this P-type channel region 38 of the vertical PJFET are thus contiguous with and 'sandwiched' between the N-type plug region 36 and the N-type material of the surrounding N-well 20, and the bottom of the P-type channel region 38 extends to and overlaps the underlying P-type substrate 25.

Figure 7:
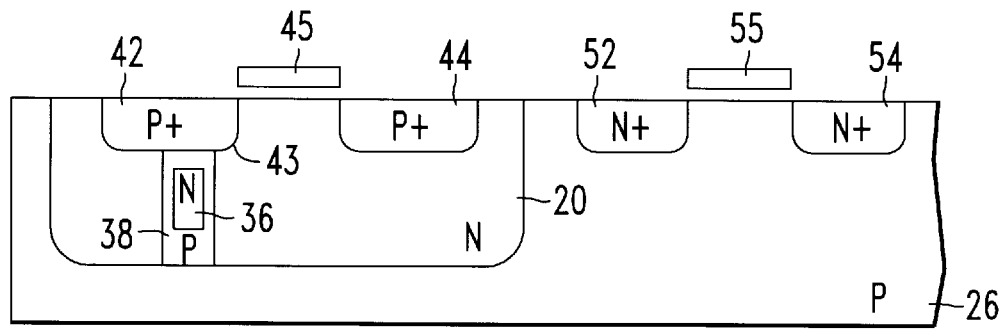
Figure 8:
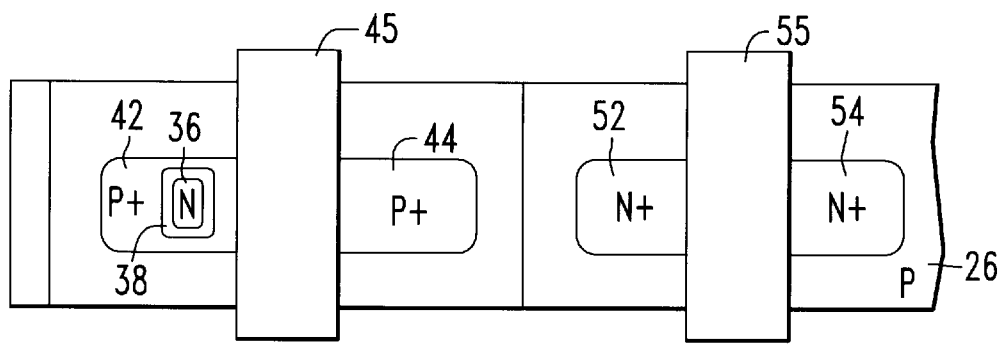

For the present example of forming the JFET channel structure 36/38 prior to the formation of the CMOS structure, respective P+source and drain regions 42 and 44 of the PMOS device are next introduced into the N-well 20, as shown in the side sectional view of FIG. 7 and the top view of FIG. 8. In addition, source and drain regions 52 and 54 of the NMOS device are formed in the adjacent P substrate 26. The gate of the PMOS device is shown at 45 and the gate of the NMOS device is shown at 55. The P+ drain region 42 of the PMOS device is sized and located so as to overlie the entirety of and intersect the annular shaped P-type channel region 38 of the vertical JFET, and thereby provide a current flow, load connection between the P-type drain region 42 of the PMOS device and the P channel 38 of the vertical JFET. The extent of the vertical diffusion of the boron is such that the P channel 38 extends down to the underlying substrate to which the vertical JFET extends, so that the channel will be terminated at the potential of the substrate. The pinch-off voltage of the vertical PJFET is established by the thickness and its doping profile of the annular P channel region 38.

Figure 1:
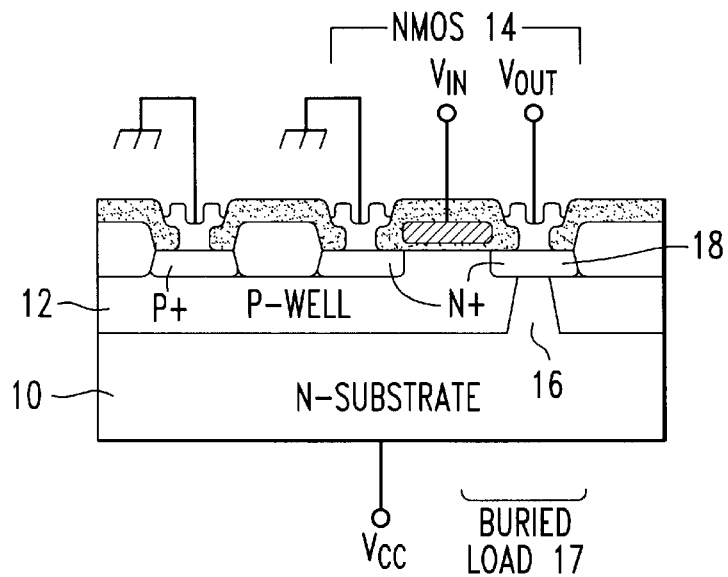
FIG. 1 diagrammatically illustrates the basic cell architecture of an prior art type of MOS device having a vertical JFET load device as described in the above-referenced Sakai et al paper.
Figure 2:
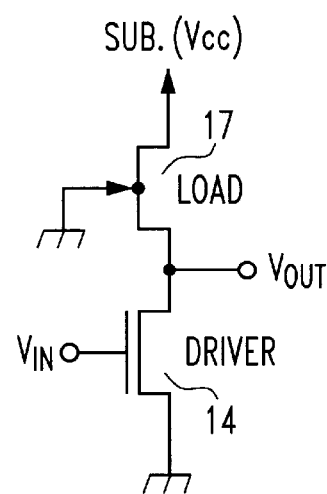
FIG. 2 is a schematic representation of the MOS device of FIG. 1.

As noted above, because the cross section of the channel region of the vertical JFET has a generally annular shape, rather than being coextensive with the entirety of the cross-section through the 'hole' in the well of the prior art structure of FIGS. 1 and 2, the current flow path through the channel region of the vertical JFET of the present invention can be now considerably more restricted—to essentially a leakage current path—and thereby provide a higher effective impedance, as is desirable for a RAM cell.

Although the foregoing description details the formation of a vertical differentially doped P-channel JFET, the present invention is also applicable to the formation of a differentially doped N-channel JFET. In such a case, the interior, channel-restricting region of the differentially doped structure will be P-type and the surrounding annular region will be N-type. In this case, separate implant masks may be employed to define the cross-sectional geometries of each of the N and P regions. For example, the N dopant that is to define the annular channel region may be implanted first and then diffused to a desired profile (which extends to the underlying N-type substrate). This may be followed by a reduced cross-section, interior P-type implant and anneal step. The combination of the mask size for the P implant and the subsequent anneal of the P dopant into the surrounding N-type channel material define the extent to which the N-channel region of the vertical JFET is restricted to the desired controlled current flow path.

Figure 9:
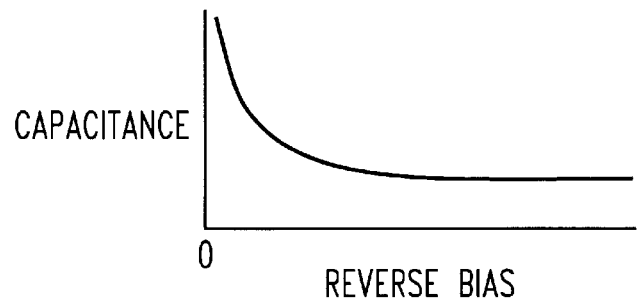
FIG. 9 shows the relationship between the capacitance C of drain-to-well junction and applied well voltage.
Figure 10:
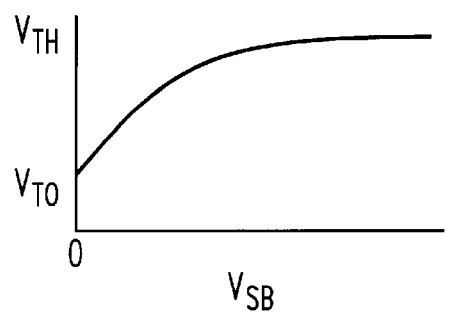
FIG. 10 shows the relationship between MOS threshold voltage $V_{TH}$ and reverse bias, source-to-well voltage $V_{SB}$.

For the case of the P-channel JFET of FIGS. 7 and 8, FIG. 9 shows the relationship between the capacitance C of the junction 43 between the P drain 42 and the N well 20, and applied well voltage, while FIG. 10 shows the relationship between MOS threshold voltage $V_{TH}$ and the reverse bias, voltage $V_{SB}$, applied between the P-source 44 and the well 20. The threshold voltage $V_{TH}$ of the MOS device is defined by equation (1) as:

$$V_{TH} \approx V_{T0} + K_B\left[\sqrt{V_{BS} + 2\phi_F} - \sqrt{2\Phi_F}\right] \tag{1}$$

where $V_{T0}$=threshold voltage at $V_{BS}$=0, $V_{BS}$=body(here, well)-to-source voltage, and $2\phi_F$=twice the surface Fermi potential.

Figure 11:
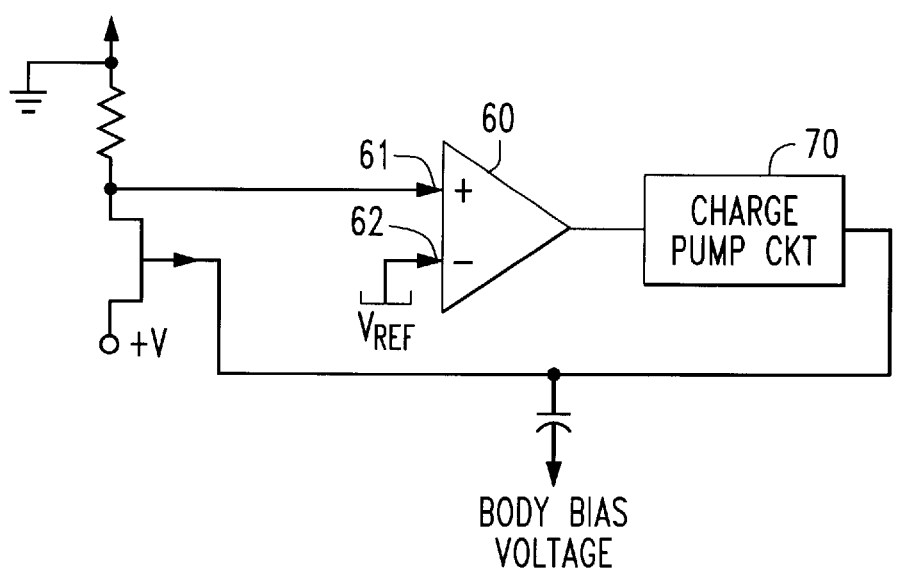
FIG. 11 diagrammatically illustrates the use of a control circuit for maintaining initial parameter setting of the operation of the differentially doped vertical PJFET-containing MOS device of the present invention.

From these relationships it can be seen that increasing the well-to-source voltage of the PMOS device will decrease the drain-to-well junction capacitance and increase the MOS threshold voltage. Since the vertical PJFET uses the PMOS well 20 as its gate, increasing the well-to-source voltage will decrease the PJFET's source-to-drain current. By initially setting the parameters of the PMOS device for a prescribed operation, for example, depletion mode operation, biasing the N well 20 can be used to control the MOS threshold, drain-to-well capacitance, and drain-to-source current of the vertical PJFET. This setting can be maintained by means of an associated control circuit, such as diagrammatically illustrated in FIG. 11.

In particular, the bias voltage of one of the load devices of the MOS cells in an overall array is applied as a first input 61 of a voltage comparator 60, to a second input of which a prescribed reference voltage VREF is supplied. The output of the comparator 60 is then scaled by means of a conventional 'charge pump' circuit 70, such as a voltage multiplier of the type typically used in electronic watch circuits, as a non-limiting example. This multiplied voltage is then applied as the bias voltage to the N well 20 of each of the MOS devices in the memory array, thereby establishing the maximum vertical JFET standby current for each memory cell.

As will be appreciated from the foregoing description, power consumption and load current control shortcomings of a conventional prior art vertical JFET load device are effectively obviated in accordance with the improved MOS cell architecture of the present invention, which employs a differentially doped, restricted channel, vertical JFET structure that contains two separate and distinct opposite conductivity type regions. Since the interior of these regions has the same conductivity as the well, the JFET channel region itself has a generally annular shape, with the pinch-off voltage of the vertical JFET being established by its cross-sectional thickness and doping profile. This reduced thickness vertical JFET channel thus forms a limited current flow path that can be very precisely tailored to restrict current flow to what is essentially a leakage current path, and thereby provide a very high load impedance.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed:

1. A semiconductor device comprising:

a semiconductor substrate of a first conductivity type;

a well region of a second conductivity type formed in a first surface portion of said semiconductor substrate;

a first region of said first conductivity type formed in a first surface portion of said well region;

a dual conductivity region formed in said well region and having a first portion of said second conductivity type, and a second portion of said first conductivity type that touches each of said first region, said first portion, said well region and said substrate, and wherein said first portion of said dual conductivity region is surrounded by said second portion of said dual conductivity region.

2. A semiconductor device according to claim 1, wherein said first region comprises a drain region of an MOS device, and said second portion of said dual conductivity region comprises a channel region of a vertical JFET device formed between said drain region of said MOS device and said substrate.

3. A semiconductor device according to claim 2, wherein said second portion of said dual conductivity region is configured as an annular shaped channel region of said vertical JFET device, surrounding said first portion of said dual conductivity region, and being surrounded by second conductivity type material of said well region.

4. A semiconductor device according to claim 2, wherein said first portion of said dual conductivity region is spaced apart from said drain region, said well region and said substrate.

5. A semiconductor device according to claim 2, further including a feedback control circuit, coupled to monitor voltage of a node of said vertical JFET device and to control application of a bias voltage to said well so as to establish maximum vertical JFET standby current through said channel.

6. An integrated MOS device and vertical JFET load device therefor comprising a semiconductor substrate of a first conductivity type having a well region of a second conductivity type, said well region containing an MOS device of said first conductivity type and a vertical JFET load device having a channel of said first conductivity type contiguous with a drain region of said MOS device and said substrate, said channel of said vertical JFET load device being configured as an annular shaped channel region that surrounds a first region of said second conductivity type and is surrounded by second conductivity type material of said well region, wherein said vertical JFET has a pinch-off voltage established by the thickness and doping profile of said annular shaped channel region.

7. An integrated MOS device and vertical JFET load device according to claim 6, further including a feedback control circuit, coupled to monitor voltage of a node of said JFET load device and to control application of a bias voltage to said well so as to establish maximum vertical JFET standby current through said annular shaped channel.

* * * * *

UNITED STATES PATENT AND TRADEMARK OFFICE
CERTIFICATE OF CORRECTION

PATENT NO. : 5,945,699
DATED : AUGUST 31, 1999
INVENTOR(S) : WILLIAM R. YOUNG

It is certified that error appears in the above-identified patent and that said Letters Patent is hereby corrected as shown below:

On the title page item [54], should read

--REDUCED WIDTH, DIFFERENTIALLY DOPED VERTICAL JFET DEVICE--

Signed and Sealed this

Twenty-fifth Day of April, 2000

Attest:

Q. TODD DICKINSON

*Attesting Officer*   *Director of Patents and Trademarks*